US010903208B2

(12) United States Patent
Cheng et al.

(10) Patent No.: US 10,903,208 B2
(45) Date of Patent: Jan. 26, 2021

(54) DISTRIBUTED DECOUPLING CAPACITOR

(71) Applicant: INTERNATIONAL BUSINESS MACHINES CORPORATION, Armonk, NY (US)

(72) Inventors: Kangguo Cheng, Schenectady, NY (US); Ali Khakifirooz, Los Altos, CA (US); Darsen D. Lu, Taichung (TW); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/739,754

(22) Filed: Jan. 10, 2020

(65) Prior Publication Data
US 2020/0152622 A1 May 14, 2020

Related U.S. Application Data

(60) Continuation of application No. 15/235,775, filed on Aug. 12, 2016, now Pat. No. 10,593,663, which is a
(Continued)

(51) Int. Cl.
*H01L 21/768* (2006.01)
*H01L 27/06* (2006.01)
(Continued)

(52) U.S. Cl.
CPC .... *H01L 27/0629* (2013.01); *H01L 21/76897* (2013.01); *H01L 21/823431* (2013.01);
(Continued)

(58) Field of Classification Search
CPC ............. H01L 27/0629; H01L 27/0207; H01L 21/76897; H01L 21/823431
(Continued)

(56) References Cited

U.S. PATENT DOCUMENTS 6,947,275 B1   9/2005   Anderson et al.
6,967,416 B2  11/2005   Clevenger et al.
(Continued)

OTHER PUBLICATIONS

U.S. Office Action issued in U.S. Appl. No. 15/235,743, dated Nov. 30, 2017, pp. 1-17.
(Continued)

*Primary Examiner* — Dzung Tran
(74) *Attorney, Agent, or Firm* — Tutunjian & Bitetto. P.C.; Robert Sullivan

(57) ABSTRACT

An electrical device including a plurality of fin structures. The plurality of fin structures including at least one decoupling fin and at least one semiconductor fin. The electrical device includes at least one semiconductor device including a channel region present in the at least one semiconductor fin, a gate structure present on the channel region of the at least one semiconductor fin, and source and drain regions present on source and drain region portion of the at least one semiconductor fin. The electrical device includes at least one decoupling capacitor including the decoupling fin structure as a first electrode of the decoupling capacitor, a node dielectric layer and a second electrode provided by the metal contact to the source and drain regions of the semiconductor fin structures. The decoupling capacitor is present underlying the power line to the semiconductor fin structures.

18 Claims, 5 Drawing Sheets

Related U.S. Application Data division of application No. 14/788,092, filed on Jun. 30, 2015, now Pat. No. 9,455,250.

(51) Int. Cl.

| | |
|---|---|
| *H01L 23/528* | (2006.01) |
| *H01L 27/092* | (2006.01) |
| *H01L 29/66* | (2006.01) |
| *H01L 29/78* | (2006.01) |
| *H01L 49/02* | (2006.01) |
| *H01L 23/522* | (2006.01) |
| *H01L 21/8238* | (2006.01) |
| *H01L 29/94* | (2006.01) |
| *H01L 21/84* | (2006.01) |
| *H01L 27/12* | (2006.01) |
| *H01L 21/8234* | (2006.01) |
| *H01L 27/02* | (2006.01) |
| *H01L 29/08* | (2006.01) |
| *H01L 23/485* | (2006.01) |

(52) U.S. Cl.
CPC ............ *H01L 21/823475* (2013.01); *H01L 21/823807* (2013.01); *H01L 21/823814* (2013.01); *H01L 21/823821* (2013.01); *H01L 21/823871* (2013.01); *H01L 21/845* (2013.01); *H01L 23/528* (2013.01); *H01L 23/5222* (2013.01); *H01L 23/5226* (2013.01); *H01L 27/0207* (2013.01); *H01L 27/0924* (2013.01); *H01L 27/1211* (2013.01); *H01L 28/60* (2013.01); *H01L 29/0847* (2013.01); *H01L 29/6681* (2013.01); *H01L 29/66795* (2013.01); *H01L 29/785* (2013.01); *H01L 29/7851* (2013.01); *H01L 29/94* (2013.01); *H01L 23/485* (2013.01); *H01L 23/5223* (2013.01); *H01L 23/5286* (2013.01)

(58) Field of Classification Search
USPC .......................................................... 438/381
See application file for complete search history.

(56) References Cited

U.S. PATENT DOCUMENTS

| | | |
|---|---|---|
| 6,995,412 B2 | 2/2006 | Fried et al. |
| 7,244,983 B2 | 7/2007 | Kim et al. |
| 7,291,877 B2 | 11/2007 | Brederlow et al. |
| 8,009,709 B2 | 8/2011 | Nelson |
| 8,076,190 B2 | 12/2011 | Chen et al. |
| 8,547,681 B2 | 10/2013 | Logan et al. |
| 8,581,320 B1 | 11/2013 | Cheng et al. |
| 8,860,107 B2 | 10/2014 | Haensch et al. |
| 9,000,840 B2 | 4/2015 | Thonnart et al. |
| 9,455,250 B1 | 9/2016 | Cheng et al. |
| 10,187,011 B2 | 1/2019 | Kumar |
| 2006/0038216 A1* | 2/2006 | Fried ................ H01L 28/90 257/296 |
| 2009/0001438 A1 | 1/2009 | Doyle et al. |
| 2010/0213520 A1* | 8/2010 | Furuta ............... H01L 21/84 257/296 |
| 2013/0193500 A1 | 8/2013 | Chen |
| 2014/0042547 A1 | 2/2014 | Khakifirooz et al. |
| 2014/0183610 A1 | 7/2014 | Lee et al. |

OTHER PUBLICATIONS

List of IBM Patents or Patent Applications Treated as Related dated Jan. 10, 2020, 2 pages.

* cited by examiner

DISTRIBUTED DECOUPLING CAPACITOR

BACKGROUND

Technical Field

The present disclosure relates to semiconductor devices, and more particularly to integrating a decoupling capacitor into an electrical structure including semiconductor devices.

Description of the Related Art

With the continuing trend towards miniaturization of integrated circuits (ICs), there is a need for transistors to have higher drive currents with increasingly smaller dimensions. The use of non-planar semiconductor devices such as, for example, silicon fin field effect transistors (FinFETs) may be the next step in the evolution of complementary metal oxide semiconductor (CMOS) devices. Decoupling capacitors are used to reduce fluctuation of power lines (VDD, GND) to semiconductor devices. Typically, decoupling capacitors require a large area for efficient decoupling. The integration of decoupling capacitors with semiconductor devices is problematic for aggressively scaled semiconductor devices.

SUMMARY

In one embodiment, the present disclosure provides electrical devices including a decoupling capacitor that is integrated with fin type field effect transistors (finFETs) on the same substrate. In one embodiment, the electrical device includes a plurality of fin structures including at least one decoupling fin structure and at least one semiconductor fin structure. The electrical device includes at least one semiconductor device including a channel region present in the at least one semiconductor fin structure, a gate structure present on the channel region of the at least one semiconductor fin structure, and source and drain regions present on source and drain region portion of the at least one semiconductor fin structure. The electrical device includes at least one decoupling capacitor including the decoupling fin structure as a first electrode of the decoupling capacitor, a node dielectric layer and a second electrode provided by the metal contact to the source and drain regions of the semiconductor fin structures. The decoupling capacitor is present underlying the power line to the semiconductor fin structures.

In another embodiment, an electrical device is provided that includes a first plurality of fin structures including at least one first decoupling fin and at least one semiconductor fin, and a second plurality of fin structures including at least one second decoupling fin structure and at least one semiconductor fin structure. The electrical device may further at least one first conductivity semiconductor device including a first channel region present in the at least one first semiconductor fin structure and first conductivity source and drain regions. The electrical device may further include at least one first decoupling capacitor including the at least one first decoupling fin structure as a first electrode and a second electrode provided by a first metal contact to the first conductivity source and drain regions. The decoupling capacitor is present underlying the power supply voltage line to the first conductivity semiconductor fin structures.

The electrical device may further include at least one second conductivity semiconductor device including a second channel region present in the at least one second semiconductor fin and second conductivity source and drain regions. The electrical device may further include at least one second decoupling capacitor including the at least one second decoupling fin structure as a first electrode and a second electrode provided by a second metal contact to the second conductivity source and drain regions. The second decoupling capacitor is present underlying the ground line to the second conductivity source and drain structures.

In another aspect, a method of forming an electrical device is provided that includes forming a plurality of fin structures, wherein at least one of the plurality of fin structures is a decoupling fin structure, and at least one of the plurality of fin structures is a semiconductor fin. The method may further include forming fin type field effect transistors (FinFETs) from each of said semiconductor fin structure, and forming a decoupling capacitor from each of said decoupling fin structures. The decoupling capacitor may include a first electrode provided by the decoupling fin structure, a node dielectric and a second electrode provided by a metal contact that transmits electrical current from a power line to the FinFETs. The decoupling capacitor is present directly underlying the power line.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
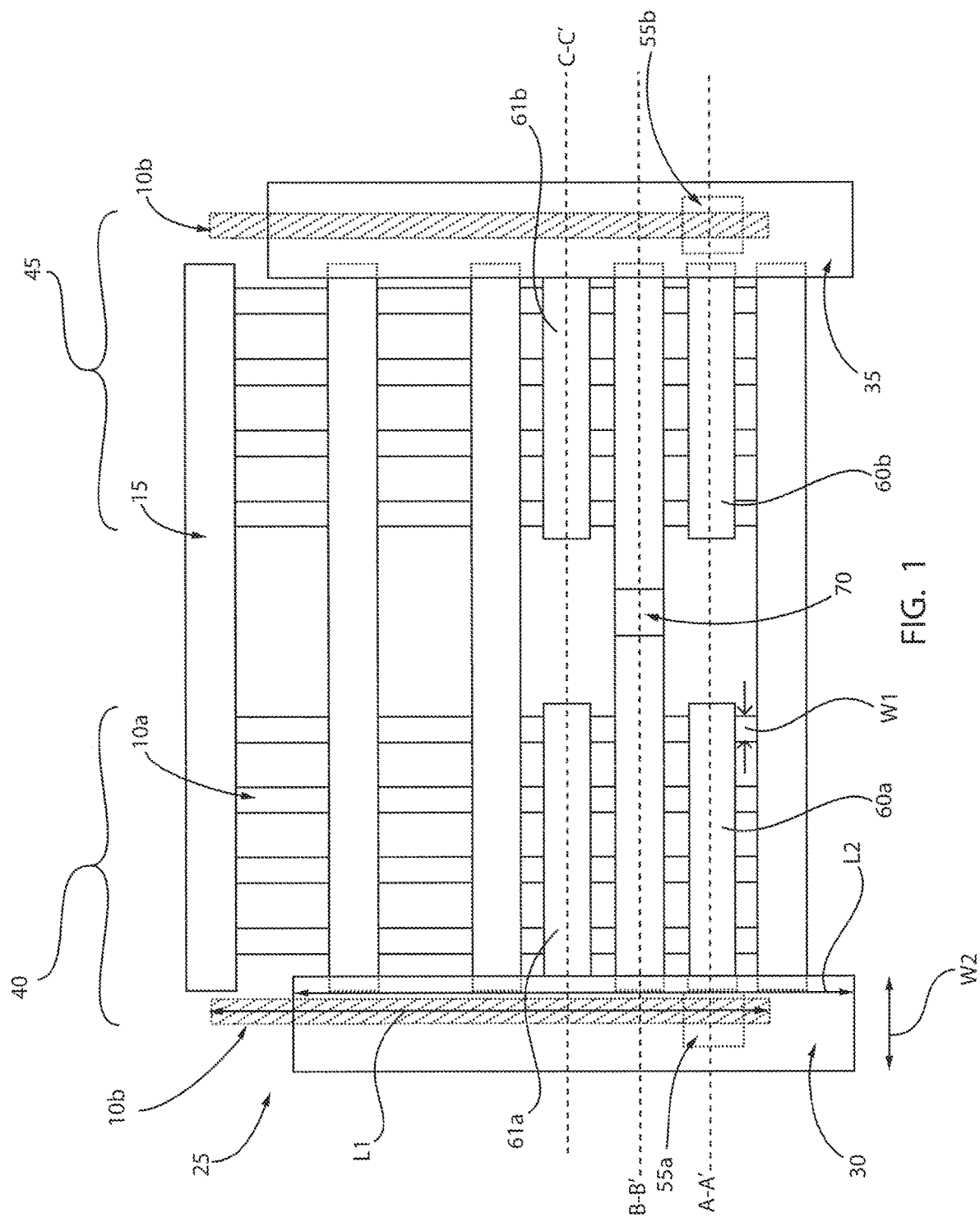
FIG. 1 is a top-down view of an electrical device including a plurality of fin structures, in which at least one of the plurality of fin structure structures provides an electrode of a decoupling capacitor and at least one of the plurality of fin structures provides the fin structure of fin type semiconductor devices (FinFETs), in accordance with one embodiment of the present disclosure.

Detailed embodiments of the claimed methods, structures and computer products are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. For purposes of the description hereinafter, the terms "upper", "over", "overlying", "lower", "under", "underlying", "right", "left", "vertical", "horizontal", "top", "bottom", and derivatives thereof shall relate to the embodiments of the disclosure, as it is oriented in the drawing figures.

The structures and methods that are disclosed herein provide a distributed decoupling capacitor formed with a fin structure that is configured to run underneath a power line that supplies power to semiconductor devices including similar fin structures, e.g., a Fin type Field Effect Transistors (FinFETs). A "field effect transistor (FET)" is a semiconductor device in which the output current, i.e., source-drain current, is controlled by the voltage applied to the gate. A FET has three terminals, i.e., gate structure, source region and drain region. The term "gate structure" means a structure used to control output current (i.e., flow of carriers in the channel) of a semiconducting device through electrical or magnetic fields. As used herein, the "fin structure" of a semiconductor device refers to a semiconductor material, which is employed as the body of a semiconductor device, in which the gate structure is positioned around the fin structure such that charge flows down the channel on the two sidewalls of the fin structure and optionally along the top surface of the fin structure.

A capacitor is a two terminal electrical device used to store energy. The terminals of the capacitor may be provided by the electrodes. The term "electrode" and "capacitor electrode" as used to describe a component of the capacitor represents one of at least two electrically conductive materials of the capacitor that are separated by a dielectric layer. The "node dielectric layer" is the dielectric layer that is present between the electrodes of the capacitor. The term "decoupling" denotes the electrical isolation of signal carrying wires from power lines. A fin structure that is present underlying a power line provides a first electrode of the decoupling capacitor, wherein the fin structure for the decoupling capacitor typically has the same geometry and base composition, e.g., silicon, germanium, silicon germanium, etc., as the fin structures for the semiconductor devices, i.e., Fin type Field Effect Transistors (FinFETs).

The decoupling capacitor is formed on the same substrate with a plurality of fin type field effect transistors (FinFETs). Typically, fin structures that are orientated under the power lines are removed, i.e., are dummy fins. In the methods and structures that are disclosed herein, the fin structure that are positioned beneath the power lines are covered with a dielectric, i.e., node dielectric, that is robust enough to be etched so that a capacitance is formed between these fins and the power supply line (VDD) and ground (GND) contacts. A contact is made to the decoupling fins, and connected to the opposite voltage polarity than the power line running above the decoupling fin structures. The decoupling capacitors and semiconductor devices including fin structures that are provided by the present disclosure are now discussed with greater detail with reference to FIGS. 1-4.

FIGS. 1-4 depict one embodiment of an electrical device including a plurality of fin structures 10a, 10b, in which at least one of the plurality of fin structure 10b provides an electrode of a decoupling capacitor and at least one of the plurality of fin structures 10a provides the fin structure of fin type semiconductor devices (FinFETs). The fin structures 10a, 10b may be composed of a semiconductor material, such as silicon (Si), germanium (Ge), silicon germanium (SiGe), silicon doped with carbon (Si:C) and combinations thereof. The fin structures 10a, 10b may have a height $H_1$ ranging from 5 nm to 200 nm. In another embodiment, each of the plurality of fin structures 10a, 10b has a height $H_1$ ranging from 10 nm to 100 nm. In one example, each of the plurality of fin structures 10a, 10b has a height $H_1$ ranging from 20 nm to 50 nm. Each of the plurality of fin structures 10a, 10b may have a width $W_1$ of less than 20 nm. In another embodiment, each of the plurality of fin structures 10a, 10b has a width $W_1$ ranging from 3 nm to 10 nm.

Although ten fin structures 10a, 10b are depicted in FIG. 1, the present disclosure is not limited to only this example. In the example depicted in FIG. 1, the plurality of fin structures includes one set of five fin structures including four semiconductor fin structures 10a for first conductivity type devices, e.g., n-type FinFETs, and a decoupling fin 10b that is directly underlying a first power line, e.g., a voltage supply line (VDD) 30. In the example depicted in FIG. 1, the plurality of fin structures includes a second set of five fin structures including four semiconductor fin structures 10a for second conductivity type devices, e.g., p-type FinFETs, and a decoupling fin 10b that is directly underlying a ground line. It is noted that any number of fin structures may be present in the plurality of fin structures 10a, 10b.

The pitch P1 separating adjacent fin structures in the plurality of fin structures 10a, 10b may range from 10 nm to 500 nm. In another example, the pitch P1 separating adjacent fin structures in the plurality of fin structures 10a, 10b may range from 20 nm to 50 nm. In one example, each of the plurality of fin structures is composed of silicon (Si) has a height H1 of 50 nm, a width W1 of 10 nm, and a pitch P1 of approximately 40 nm, e.g., 42 nm.

In some embodiments, each of the plurality of fin structures 10a, 10b have substantially a same geometry, i.e., the same physical dimensions, and each of the plurality of fin structures 10a, 10b have substantially a same base composition. By "base composition" it is meant the intrinsic semiconductor composition prior to doping with an n-type or p-type dopant. For example, silicon (Si), germanium (Ge) and silicon-germanium (SiGe), and type III-V semiconductor materials, such as gallium arsenide (GaAs), are examples of base compositions, which do not include dopants, such as boron (B) and phosphorus (P) in type IV semiconductors or silicon (Si) in a III-V semiconductor material.

The electrical device includes at least one semiconductor device that includes a channel region present in the at least one semiconductor fin structure 10b, a gate structure 15 present on the channel region of the at least one semiconductor fin structure 10b, and source and drain regions 20a, 20b, 21a, 21b present on source and drain region portion of the at least one semiconductor fin structure 10a. In the example, depicted in FIGS. 1-4, the semiconductor device 5 is a Fin Field Effect Transistor (FinFET).

The gate structure 15 typically includes at least one gate electrode, and at least one gate dielectric layer. A "gate structure" means a structure used to control output current (i.e., flow of carriers in the channel) of a semiconducting device through electrical fields. The at least one gate dielectric layer may be directly present on the channel region of the semiconductor fin structures. The gate dielectric may be a dielectric material, such as $SiO_2$, or alternatively high-k dielectrics, such as oxides of Hf, Ta, Zr, Al or combinations thereof. In another embodiment, the at least one gate dielectric is comprised of an oxide, such as $SiO_2$ or $HfO_2$. The at least one gate electrode is formed atop the gate dielectric, and is composed of a conductive material. The conductive material of the gate electrode may comprise polysilicon, SiGe, a silicide, a metal or a metal-silicon-nitride such as Ta—Si—N. Examples of metals that can be used as the conductive material include, but are not limited to, Al, W, Cu, and Ti or other like conductive metals. The blanket layer of conductive material may be doped or undoped. If doped, an in-situ doping deposition process may be employed. Alternatively, a doped conductive material can be formed by deposition, ion implantation and annealing. The gate structure 15 may also include gate sidewall spacer (not shown) that are present along the sidewalls of the gate structure 15 including the sidewalls of the gate electrode and the gate dielectric. The gate sidewall spacer may be an oxide, nitride or oxynitride material, which can also be a high-k dielectric material. For example, the gate sidewall spacer may be composed of silicon oxide ($SiO_2$) or silicon nitride ($Si_3N_4$). As will be described in greater detail below, the gate sidewall spacer may be composed of the same composition dielectric material as the later described node dielectric 65 of the decoupling capacitor 25. Therefore, the below description of composition of the node dielectric 65 may be suitable for the description of the composition of the gate sidewalls spacer.

The source and drain regions 21a, 21b are present on source and drain region portions of the fin structures 10a, 10b that are present on opposing sides of the gate structure 15. As used herein, the term "drain" means a doped region in semiconductor device located at the end of the channel, in which carriers are flowing out of the transistor through the drain. As used herein, the term "source" is a doped region in the semiconductor device, in which majority carriers are flowing into the channel. The source and drain regions 20a, 20b, 21a, 21b of the semiconductor devices may include an epitaxially formed semiconductor portion that extends between fin structures of the semiconductor devices having the same conductivity type. This may be referred to as merged epitaxial source and drain regions. The source and drain regions 20a, 20b, 21a, 21b may also include extension portions, which are doped regions formed in the source and drain region portions of the fin structures. It is noted that the source and drain regions 20a, 20b, 21a, 21b are not shown in FIG. 1 for the purposes of more clearly depicting the fin structures 10a, 10b, but the source and drain regions 20a, 20b, 21a, 21b are not shown in FIGS. 2 and 4.

The term "conductivity type" denotes a dopant region being p-type or n-type. An n-type conductivity (which may be referred to as a first conductivity type) semiconductor device, e.g., n-FinFET, is a semiconductor device having source and drain regions of an n-type conductivity. A p-type conductivity (which may be referred to as a second conductivity type) semiconductor device, e.g., p-FinFET, is a semiconductor device having source and drain regions of a p-type conductivity.

In the embodiment depicted in FIGS. 1-4, a first group of semiconductor fin structures 10a is present in a first region 40 of the electrical device, in which the semiconductor devices are processed to provide n-type semiconductor devices, such as n-type FinFETs, and a second group of semiconductor fin structures 10a is present in a second region 45 of the electrical device, in which the semiconductor devices are processed to provide p-type semiconductor devices, such as p-type finFETs.

In the embodiment that is depicted in FIGS. 1-4, a first power supply line 30, e.g., positive voltage power supply line (VDD), is present in electrical communication to the source regions 20a of the semiconductor fin structures 10b in the first region 40 of the electrical device by electrically conductive features, such as an electrically conductive via 55a and an electrically conductive contact 60a. A second power supply line 35, e.g., ground line (GND), is present in electrical communication to the source regions 20b of the semiconductor fin structures 10b in the second region 45 of the electrically conductive device by electrically conductive features, such as an electrically conductive via 55b and an electrically conductive contact 60b.

In some embodiments, the semiconductor devices, e.g., n-type FinFETs and p-type FinFETs, as well as the decoupling capacitor are present underlying an interlevel dielectric (not shown), which may be an oxide, nitride, oxynitride or may be a polymeric dielectric material. The electrically conductive features, i.e., the electrically conductive vias 55a, 55b and the electrically conductive contacts 60a, 60b, extend through the interlevel dielectric layers to transmit electrical current, e.g., electrical signals between at least the semiconductor devices, e.g., n-type FinFETs and p-type FinFETs, and the power lines, i.e., first power supply line 30, e.g., positive voltage power supply line (VDD), and second power supply line 35, e.g., ground line (GND).

The first power supply line 30, e.g., positive voltage power supply line (VDD), and the second power supply line 35, e.g., ground line (GND), as well as the electrically conductive features, i.e., the electrically conductive vias 55a, 55b and the electrically conductive contacts 60a, 60b may be composed of any electrically conductive material. The term "electrically conductive material" denotes a material having a room temperature conductivity of greater than $10^{-8}(\Omega\text{-m})^{-1}$. For example, at least one of the first power supply line 30, e.g., positive voltage power supply line (VDD), the second power supply line 35, e.g., ground line (GND), the electrically conductive vias 55a, 55b and the electrically conductive contacts 60a, 60b may be composed of copper (Cu), tungsten (W), aluminum (Al), platinum (Pt), silver (Ag), gold (Au), as well as electrically conductive semiconductor material, such as doped, i.e., n-type or p-type, polysilicon, and combinations and alloys thereof including metal semiconductor alloys, such as silicides.

Figure 2:
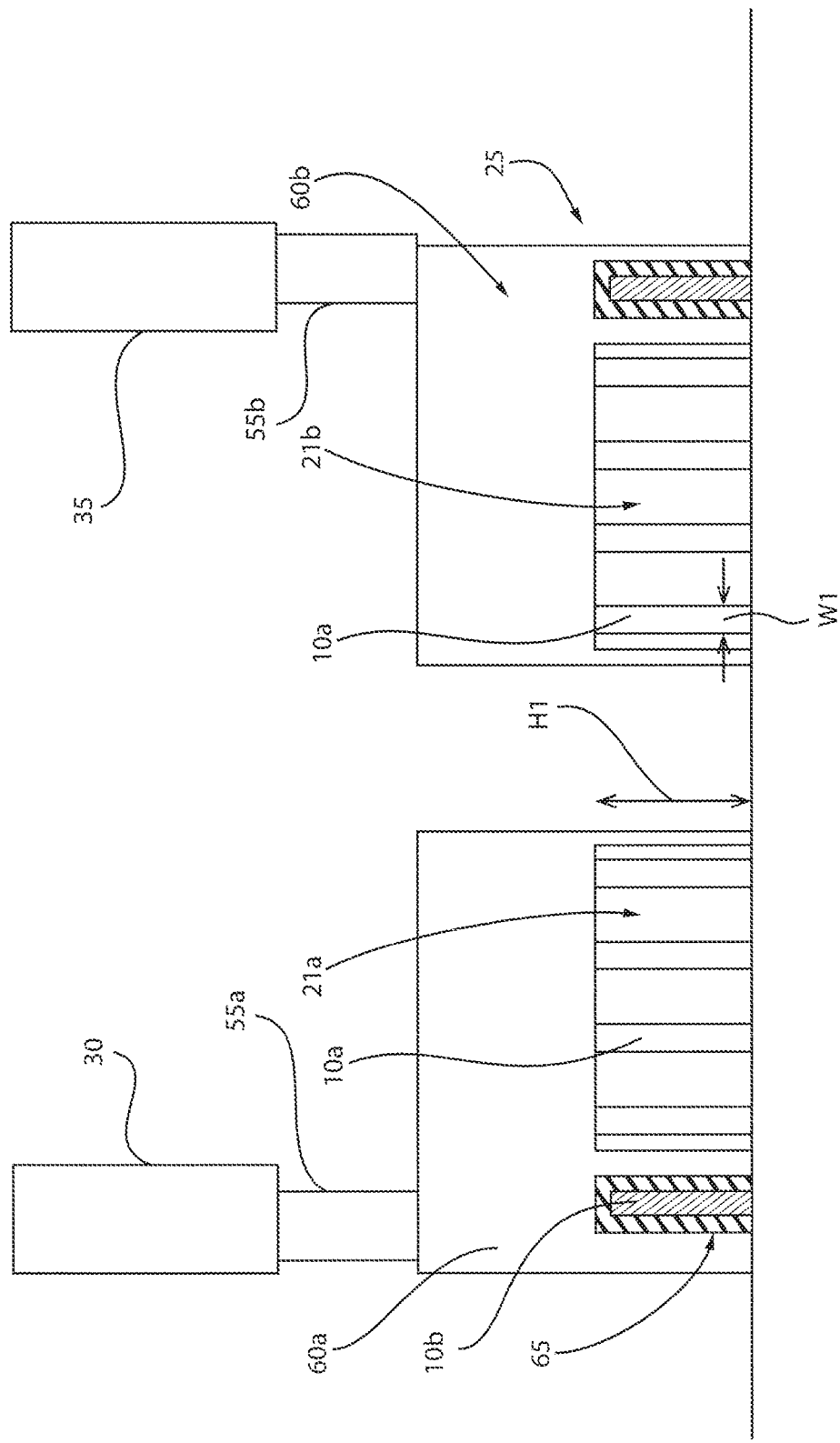
FIG. 2 is a side cross-sectional view of the electrical device depicted in FIG. 1 along section line A-A.

As will be further described below, each of the first power supply line 30, e.g., positive voltage power supply line (VDD), and the second power supply line 35, e.g., ground line (GND) typically have a width W2 that is wider than a width W1 of the fin structures, e.g., the decoupling fin 10b. In some embodiments, by positioning the decoupling fin 10b in the area underlying the first power supply line 30, e.g., positive voltage power supply line (VDD), and/or the second power supply line 35, e.g., ground line (GND), a decoupling capacitor may be positioned within an electrical device scaled to increasing dimensions previously not considered. As depicted in FIGS. 1 and 2, in some embodiments, the perimeter of the electrically conductive vias 55a, 55b are present within the width W2 of their corresponding first power supply line 30, e.g., positive voltage power supply line (VDD), and the second power supply line 35, e.g., ground line (GND). In one embodiment, the first power supply line 30, e.g., positive voltage power supply line (VDD), and/or the second power supply line 35, e.g., ground line (GND), may each have a width W2 on the order of 3 nm to 200 nm. In another embodiment, the first power supply line 30, e.g., positive voltage power supply line (VDD), and/or the second power supply line 35, e.g., ground line (GND), may each have a width W2 on the order of 15 nm to 35 nm.

Figure 3:
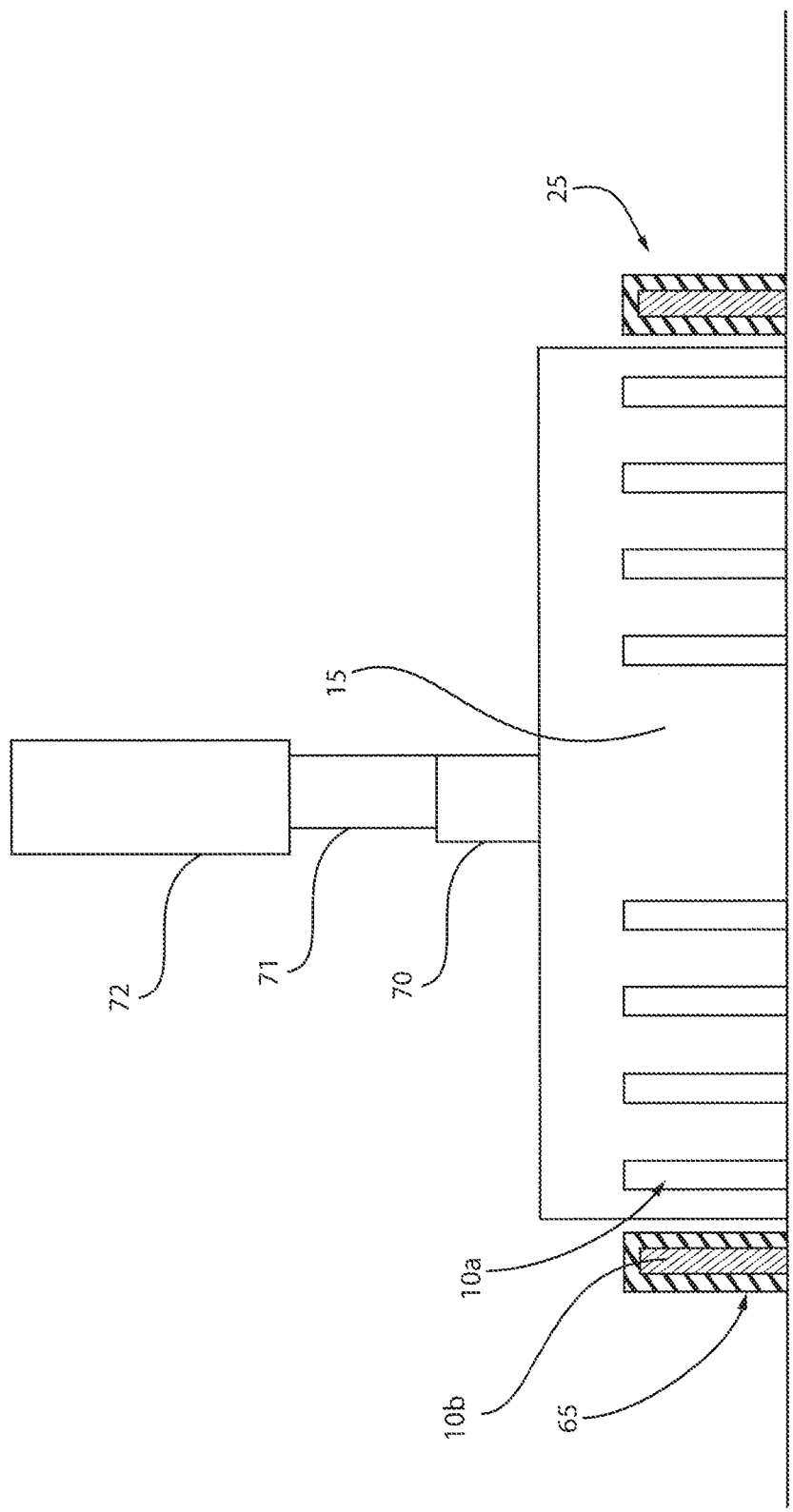
FIG. 3 is a side cross-sectional view of the electrical device depicted in FIG. 1 along section line B-B.

The semiconductor devices 5, e.g., n-type FinFETs and p-type FinFETs, also include a gate contact 70 that is similar in composition to the electrically conductive contacts 60a, 60b that provide electrical communication to the first and second power supply lines 30, 35. The gate contact 70 may be in direct contact with the gate electrode of the gate structure 15, and can be in electrical communication to a gate line (PC) 72 through a gate via 71, as depicted in FIG. 3. The gate line 72 is similar in geometry and composition to the first and second power supply lines 30, 35. The gate via 71 may be similar in composition and geometry to the electrically conductive vias 55a, 55b.

Figure 4:
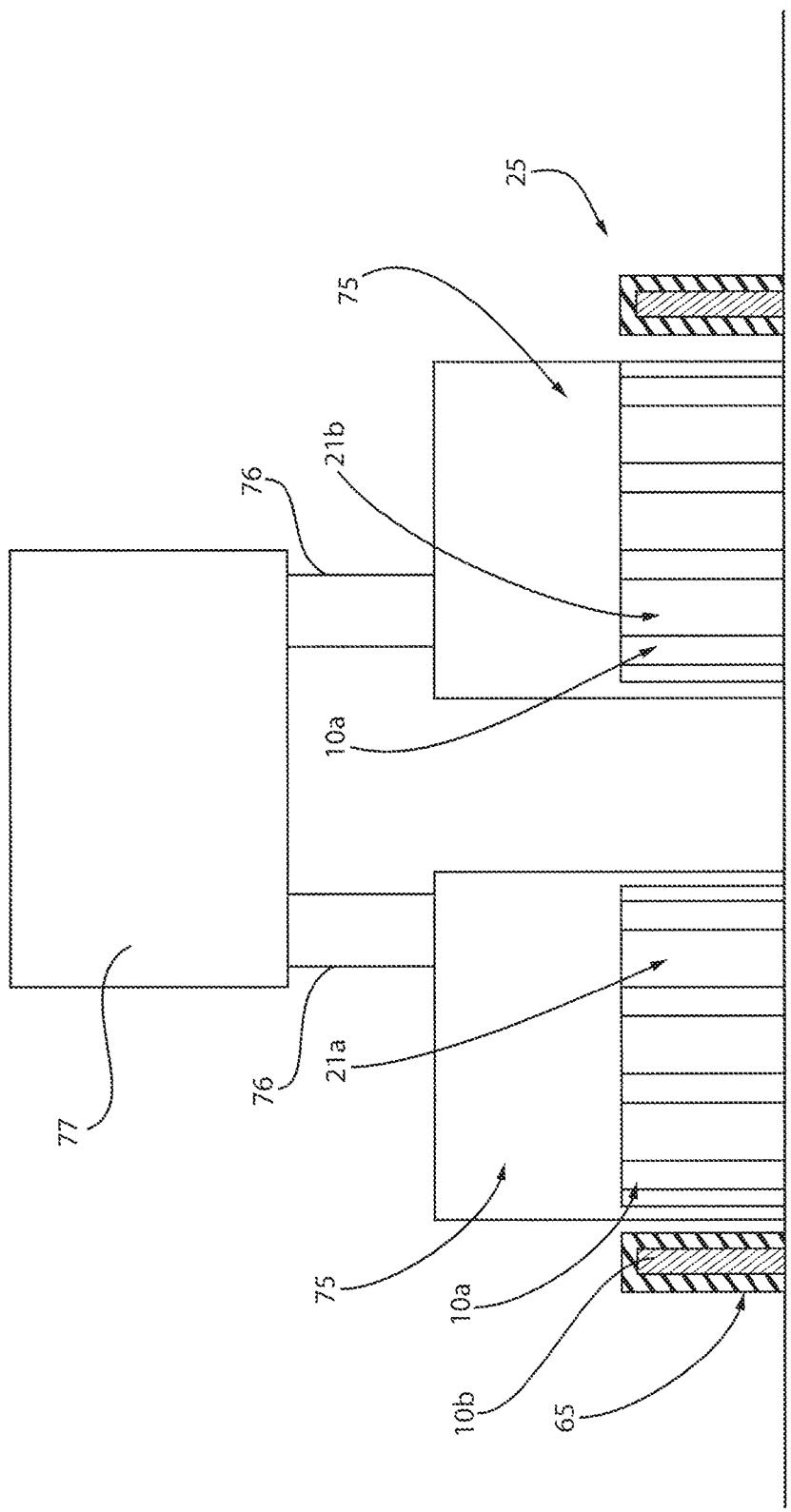
FIG. 4 is a side cross-sectional view of the electrical device depicted in FIG. 1 along section line C-C.

Referring to FIG. 4, the semiconductor devices, e.g., n-type FinFETs and p-type FinFETs, also include a drain contacts 75 in direct contact with the drain structures 21a, 21b that are on an opposite side of the gate structure 15. Similar to the gate contact 70 and the electrically conductive contacts 60a, 60b, the drain contact 75 is typically composed of an electrically conductive material. The above description of the materials suitable for the electrically conductive contacts 60a, 60b are suitable for the drain contacts 75. The drain contact 75 can be in electrical communication to a drain line 77 through a drain via 76, as depicted in FIG. 4. The drain line 77 is similar in geometry and composition to the first and second power supply lines 30, 35. The drain via 76 may be similar in composition and geometry to the electrically conductive vias 55a, 55b.

Referring to FIGS. 1-4, the at least one decoupling capacitor 25 of the electrical device typically includes the decoupling fin structure 10b as a first electrode of the decoupling capacitor 25, a node dielectric layer 65 and a second electrode provided by the metal contact 60a to the source and drain regions 20 of the at least one semiconductor fin structures 10a, wherein the decoupling capacitor 25 is present underlying the power line 30, 35 to the semiconductor devices, e.g., n-type FinFETs and/or p-type FinFETs.

In one embodiment, the first power line 30, e.g., positive power supply line (VDD), is present over the decoupling fin structure 10b that is present adjacent to the semiconductor fin structures 10a in the first region 40 of the electrical device, in which n-type semiconductor devices, such as an n-type FinFET, are present. In this example, in addition to the decoupling fin structure 10b being present under the first power line 30, e.g., positive power supply line (VDD), the perimeter of the electrically conductive via 55a (when viewed from a top down perspective as illustrated in FIG. 1) that is in electrical communication with the electrically conductive contacts 60a to the source and drain regions 20 of the semiconductor fin structures 10b in the first region 40 is also within the width of the first power line 30. In this example, the electrically conductive contact 60a provides the second electrode, i.e., upper electrode, of the decoupling capacitor 25. In one embodiment, the first power line 30, e.g., positive power supply line (VDD), is present over the decoupling fin structure 10b that is present adjacent to the semiconductor fin structures 10a in the first region 40 of the electrical device, in which n-type semiconductor devices, such as an n-type FinFET, are present. In this example, in addition to the decoupling fin 10b being present under the first power line 30, e.g., positive power supply line (VDD), the perimeter of the electrically conductive via 55a (when viewed from a top down perspective as illustrated in FIG. 1) that is in electrical communication with the electrically conductive contacts 60a to the source and drain regions 20 of the semiconductor fin structures 10b in the first region 40 is also within the width of the first power line 30.

As depicted in FIG. 1, which illustrates a top down view of the decoupling fin structures 10b, and the first and second power lines 30, 35, each of the first and second decoupling fin structures 10a, 10b have length L1 substantially parallel to a length L2 of the corresponding first and second power line 30, 35. By substantially parallel the length L1 of the decoupling fin structures 10b, and the length L2 of the corresponding first or/second power line 30, 35 extend along a same direction.

FIG. 1 further depicts that the decoupling fin structure 10b in the first region 40 of the electrical device is present directly under the first power line 30, i.e., the positive power supply line (VDD), and that the decoupling fin structure 10b in the second region 45 of the electrical device is present directly under the second power line 35, i.e., the ground line (GND). By "directly underlying" it is meant that the width W1 of the decoupling fin structure 10b is contained within the width W2 of the corresponding first and second power line 30, 35 that the decoupling fin structure 10b is present under for the length of the decoupling fin structure 10b that is present under a length (which can be a portion of the length or an entire length) of the first and second power line 30, 35.

The decoupling fin structure 10b in the first region 40 of the device may be connected to a ground line (GND), and the decoupling fin structure 10b in the second region 45 of the device may be connected to a power supply line (VDD).

The node dielectric layer 65 is typically a conformal layer that is formed on the sidewalls and upper surface of the decoupling fin 10b. The term "conformal layer" denotes a layer having a thickness that does not deviate from greater than or less than 30% of an average value for the thickness of the layer. In some embodiments, the thickness of the node dielectric layer 65 may range from 0.5 nm to 20 nm. In other embodiments, the thickness of the node dielectric layer 65 may range from 1 nm to 5 nm. The node dielectric layer 65 may be composed of any dielectric layer, such as oxides, nitride or oxynitride materials. For example, the node dielectric layer 65 may be composed of silicon oxide ($SiO_2$), or the node dielectric layer 65 may be composed of silicon nitride ($Si_3N_4$). The node dielectric layer 65 may be a high-k dielectric material. The term "high-k" denotes a material having a dielectric constant that is greater than the dielectric constant of silicon oxide ($SiO_2$). For example, the node dielectric layer 65 typically has a dielectric constant that is greater than 4.0. In another example, a high-k dielectric material that may be employed for the node dielectric layer 65 has a dielectric constant that is greater than the 10. In yet another embodiment, the high-k dielectric material for the node dielectric layer 65 is comprised of a material having a dielectric constant ranging from 10 to 30. The dielectric constants mentioned herein are relative to a vacuum at room temperature, i.e., 20° C. to 25° C. Some examples of high-k dielectric materials suitable for the node dielectric layer 65 include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof. In one example, the node dielectric layer 65 is hafnium oxide ($HfO_2$).

Referring to FIGS. 1 and 2, the upper electrode of the decoupling capacitor 25 is provided by the electrically conductive structures 60a, 60b that provide for electrical communication from the source/drain regions 20a, 20b of the semiconductor devices including the semiconductor fin structures 10a, e.g., n-type or p-type FinFETs. This is just one example of the embodiments within the scope of the present disclosure. For example, the upper electrode of the decoupling capacitor can be any power line used by circuits (e.g., power line to gates). As depicted in FIGS. 1 and 2, the electrically conductive structures 60a, 60b are in direct contact with the node dielectric 65 of the decoupling capacitor 25 along section line A-A. Referring to FIGS. 3 and 4, the gate contact 70 and the drain contact 75 is separated from the decoupling capacitor 25.

The decoupling capacitors 25 can be used to reduced fluctuation of power lines (VDD, GND) 30, 35 to semiconductor devices 5. The decoupling capacitors 25 can be inserted between the VDD line and the ground (GND) line to absorb the extra charge accidentally induced into the tow lines, thereby preventing voltage fluctuation.

Referring to FIGS. 1 and 2, in one example, in which the fin height H1 is approximately 50 nm, the fin width W1 is approximately 10 nm, and the fin pitch is approximately 40 nm, wherein the node dielectric 65 has a thickness of 2 nm and is composed of hafnium oxide, the decoupling capacitor may have a capacitance on the order of 3.3 fF/μm, which is approximately 2.6 times greater than a similar planar capacitor. The cross-section along section line A-A depicted in FIG. 2 illustrates a large capacitance between the first power line 30 (positive power supply line (VDD) and the decoupling capacitor 25 in the first region 40 of the device, and a large capacitance between the second power line 35 (ground line (GND) and the decoupling capacitor in the second region 45 of the device.

In another aspect of the present disclosure, a method of forming an electrical device including a decoupling capacitor 25 is provided. The method may include forming an electrical device that includes forming a plurality of fin structures 10a, 10b, wherein at least one of the plurality of fin structures is a decoupling fin 10b, and at least one of the plurality of fin structures is a semiconductor fin 10b, at step 100 of the method depicted in FIG. 5.

The fin structures 10a, 10b are typically formed using deposition, photolithography, i.e., patterning, and etch processes. In one embodiment, the patterning process used to define each of the fin structures 10a, 10b is a sidewall image transfer (SIT) process. The SIT process can include forming a mandrel material layer (not shown) on the material layer that provides the fin structures 10a, 10b, such as the SOI layer of an SOI substrate. The mandrel material layer can include any material (semiconductor, dielectric or conductive) that can be selectively removed from the structure during a subsequently performed etching process. In one embodiment, the mandrel material layer may be composed of amorphous silicon or polysilicon. In another embodiment, the mandrel material layer may be composed of a metal, such as, e.g., aluminum (Al), tungsten (W), or copper (Cu). The mandrel material layer can be formed by a deposition method, such as chemical vapor deposition or plasma enhanced chemical vapor deposition. In one embodiment, the thickness of the mandrel material layer can be from 50 nm to 300 nm. Following deposition of the mandrel material layer, the mandrel material layer can be patterned by lithography and etching to form a plurality of mandrel structures on the topmost surface of the semiconductor containing material that provides the fin structures 15, e.g., the SOI layer of an SOI substrate.

In some embodiments, the SIT process may continue by forming a dielectric spacer on each sidewall of each mandrel structure. The dielectric spacer can be formed by deposition of a dielectric spacer material, and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, but are not limited to, chemical vapor deposition (CVD), plasma enhanced chemical vapor deposition (PECVD), or atomic layer deposition (ALD). Examples of etching that be used in providing the dielectric spacers include any etching process such as, e.g., reactive ion etching (RIE). Since the dielectric spacers are used in the SIT process as an etch mask, the width of the each dielectric spacer determines the width of each fin structure 10a, 10b.

In some embodiments, after formation of the dielectric spacers, the SIT process continues by removing each mandrel structure. Each mandrel structure can be removed by an etching process that is selective for removing the mandrel material as compared to silicon. Following the mandrel structure removal, the SIT process continues by transferring the pattern provided by the dielectric spacers into the semiconductor material layer that provides the fin structures 10a, 10b, such as the SOI layer of an SOI substrate. The pattern transfer may be achieved by utilizing at least one etching process that can include dry etching, such as reactive ion etching (RIE), plasma etching, ion beam etching or laser ablation, chemical wet etch processes or a combination thereof. In one example, the etch process used to transfer the pattern may include one or more reactive ion etching (RIE) steps. The etching steps pattern the semiconductor material layer to provide the fin structures 10a, 10b. Following etching, i.e., pattern transfer, the SIT process may conclude with removing the dielectric spacers using an etch process or a planarization process.

It is noted that the aforementioned spacer image transfer (SIT) process is only one method of forming the fin structures 10a, 10b. In another embodiment, each of the fin structures 10a, 10b may be formed using a photoresist etch mask. Specifically, in one example, a photoresist mask is formed overlying the semiconductor composition layer which provides the fin structures 10a, 10b. The exposed portions of the semiconductor layer that provides the fin structures 10a, 10b that are not protected by the photoresist mask are removed using a selective etch process. To provide the photoresist mask, a photoresist layer is first positioned on the semiconductor layer that provides the fin structure 10a, 10b, e.g., SOI layer of an SOI substrate. The photoresist layer may be provided by a blanket layer of photoresist material that is formed utilizing a deposition process such as, e.g., plasma enhanced CVD (PECVD), evaporation or spin-on coating.

The blanket layer of photoresist material is then patterned to provide the photoresist mask utilizing a lithographic process that may include exposing the photoresist material to a pattern of radiation and developing the exposed photoresist material utilizing a resist developer. Following the formation of the photoresist mask, an etching process may remove the unprotected portions of the semiconductor layer that provides the fin structures 10a, 10b. The etch process may be an anisotropic process, such as reactive ion etch (RIE).

It is noted that the decoupling fins 10b and the semiconductor fins 10a may be formed simultaneously using the same process sequence, in which the material composition and the geometry of the decoupling fins 10b is the same as the semiconductor fins 10a.

Further description of the fin structures 10a, 10b is provided above with reference to FIGS. 1-4. For example, a first plurality of semiconductor fin structures 10a and a corresponding decoupling fin structure 10b are present in a first region 40 of the device to be processed to provide n-type FinFETs and a decoupling capacitor 25, and a second plurality of semiconductor fin structures 10 and a corresponding decoupling fin structure 10b are present in a second region 45 of the device to be processed to provide p-type FinFETs and a decoupling capacitor 25. The source region of the n-type FinFETs are in electrical communication with a positive supply voltage (Vdd) line and the decoupling fin structure 10b in the first region 40 is in electrical communication in a ground line (GND). The source region of the p-type FinFETs are in electrical communication with a ground line (GND) and the decoupling fin structure 10b in the second region 45 is in electrical communication with a positive supply voltage (Vdd) line.

Figure 5:
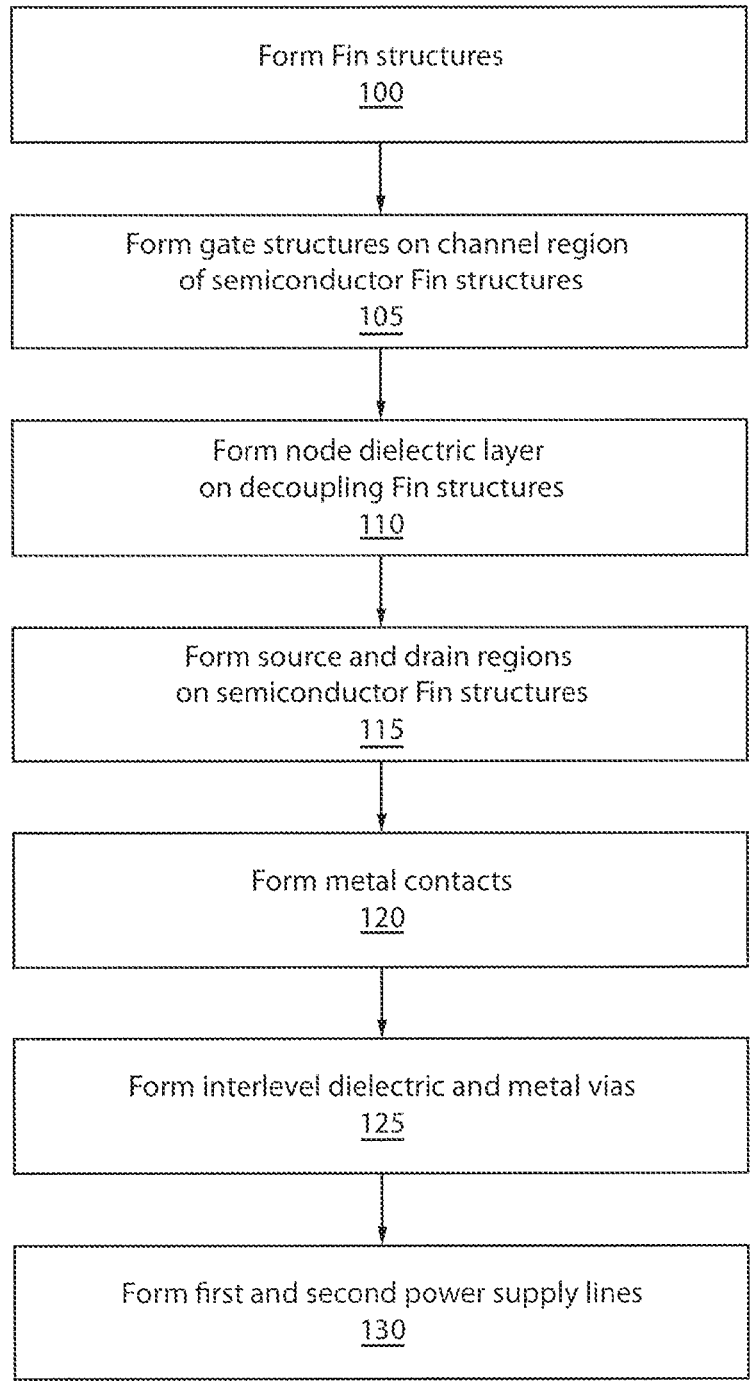
FIG. 5 is a flow chart describing one method of forming an electrical device including a decoupling capacitor, in accordance with the present disclosure.

At step 105 of the process flow depicted in FIG. 5, gate structures 15 may be formed on the channel regions of the semiconductor fin structures 10a. During this stage of the process flow, the decoupling fin structures 10b may be covered with a block mask, e.g., photoresist mask, to ensure that gate structures 15 are not formed on the decoupling fin structures 10b. The gate structures 15 may be formed by using a deposition method, such as a chemical vapor deposition method and/or a physical vapor deposition (PVD), to deposit the material layers for the at least one gate dielectric layer and the at least one gate electrode followed by photolithography and etch processing. Following formation of the gate electrode and the gate dielectric for the gate structures 15, any blocking structures, such as block masks, e.g., photoresist block masks, may be removed from covering the decoupling fin structures 10b.

A gate sidewall spacer can be formed on the sidewall of the gate structure. In one embodiment, the gate sidewall spacer may be formed by using a blanket layer deposition process, such as CVD, and an anisotropic etchback method. The gate sidewall spacer may have a width ranging from 2.0 nm to 15.0 nm, and may be composed of a dielectric, such as a nitride, oxide, oxynitride, or a combination thereof.

At step 110, the node dielectric layer 65 is formed on the decoupling fin structures 10b. The node dielectric layer 65 may be formed using a deposition process, such as chemical vapor deposition (CVD). Variations of CVD processes include, but not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. It is noted that the node dielectric layer 65 does not need to be a material layer that is formed separately from other dielectric layers formed on the electronic device. For example, the node dielectric layer 65 may be formed simultaneously with the gate dielectric of the gate structure or the gate sidewall spacer.

The source and drain regions 20a, 20b, 21a, 21b of the FinFETs may then be formed at step 115 of the process flow depicted in FIG. 5. In some embodiments, forming the source and drain regions 20a, 20b, 21a, 21b may include epitaxially forming in situ doped source and drain semiconductor material, such as silicon and germanium containing material, e.g., SiGe, on the source and drain region portions of the semiconductor fin structures 10a. The term "in-situ" as used to describe the dopant that provides the conductivity type of the source and drain semiconductor material means that the dopant, e.g., p-type dopant, that dictates the conductivity type of the epitaxially formed in situ doped source and drain semiconductor material is introduced during the process step, e.g., epitaxial deposition, which forms the in situ doped source and drain semiconductor material.

In some embodiments, extension source and drain regions may be formed after the epitaxially formed in situ doped source and drain semiconductor material are positioned on the source and drain region portions of the semiconductor fin structures 10a by thermally diffusing the p-type dopant from in situ doped source and drain semiconductor material into the underlying portion of the fin structures 10a. Ion implantation may also be used to dope the source and drain regions of the device.

It is noted that the decoupling fin 10b may be protected during the growth of the epitaxial material by a block mask, e.g., photoresist block mask, which would obstruct the formation of epitaxial material on the decoupling fin 10b. Further, in some embodiments, because the node dielectric layer 65 is present on the decoupling fin structure 10b, the epitaxial material for the source and drain regions 20a, 20b, 21a, 21b will not be formed on the dielectric material of the node dielectric layer 65.

Different conductivities for the source and drain regions 20a, 20b, 21a, 21b in the different regions 40, 45 of the device may be dictated by employing block masks to individually process one region of the substrate while the other region is protected by the block mask.

In a following step, i.e., step 120, metal contacts 60a, 60b, 70, 75 may be formed to the source and drain regions 20a, 20b, 21a, 21b, and the gate structure 15. The metal contacts 60a, 60b to the source regions 20a, 20b that are present on the semiconductor fin structures 10a, can also be the upper electrode for the decoupling capacitor, i.e., a portion of the metal contacts 60a, 60b is formed directly on the node dielectric layer 65. The metal contacts 60a, 60b, 70, 75 may be formed using deposition and etch processes. For example, a metal containing material for the metal contacts 60a, 60b, 70, and 75 may be deposited using physical vapor deposition (PVD), such as plating or sputtering. The deposited materials may then be patterned and etched using photolithography in combination with an etch process, such as reactive ion etch.

At step 125, an interlevel dielectric having metal vias 55a, 55b, 71, and 76 may be formed. The interlevel dielectric layer may be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the interlevel dielectric layer include any of the aforementioned materials in porous form, or in a form that changes during processing to or from being porous and/or permeable to being non-porous and/or non-permeable.

The metal vias 55a, 55b, 71, 76 extend through the interlevel dielectric to the metal contacts 60a, 60b, 70, 75. Openings are formed through the interlevel dielectric layer using photolithography and etch processes. Following via opening formation, metal vias 55a, 55b, 71, 76 are formed by depositing a conductive material, e.g., metal, into the via holes using deposition methods, such as CVD, sputtering or plating. The conductive metal may include, but is not limited to: tungsten, copper, aluminum, silver, gold and alloys thereof.

In a following step, i.e., step 130, the first and second power supply lines 30, 35 may be formed in electrical communication with metal vias 55a, 55b. The first and second power supply lines 30, 35 may be formed using deposition and etch processes. For example, a metal containing material for first and second power supply lines 30, 35 may be deposited using physical vapor deposition (PVD), such as plating or sputtering. The deposited materials may then be patterned and etched using photolithography in combination with an etch process, such as reactive ion etch.

Further description of the first and second power supply lines 30, 35 is provided above with reference to FIGS. 1-4. The length L2 of the power lines, i.e., first and second power lines 30, 35 may be substantially parallel to the length L1 of the decoupling fin structure 10b. A decoupling fin structure 10b may be present directly under at least one of the power lines, e.g., first and second power supply lines 30, 35. In one embodiment, the first power supply line 30 may be a positive supply voltage (VDD) line that is present in the first region 40 of the electrical device and is in electrical communication to the source region 20a of the semiconductor fin structures 10a of the n-type FinFETs. The width W1 of the decoupling fin structure 10b is less than the width W2 of the first power supply line 30 so that the entire width of the decoupling fin structure 10b is directly underlying the first power supply line 30. In one embodiment, the second power supply line 35 may be a ground (GND) line that is present in the second region 45 of the electrical device and is in electrical communication to the source region 20b of the semiconductor fin structures 10a of the p-type FinFETs. The width W1 of the decoupling fin structure 10b is less than the width W2 of the second power supply line 35 so that the entire width of the decoupling fin structure 10b is directly underlying the second power supply line 35.

The methods and structures that have been described above with reference to FIGS. 1-5 may be employed in any electrical device. For example, the metal vias and metal containing lines that are disclosed herein may be present within electrical devices that employ semiconductors that are present within integrated circuit chips. The integrated circuit chips including the disclosed interconnects may be integrated with other chips, discrete circuit elements, and/or other signal processing devices as part of either (a) an intermediate product, such as a motherboard, or (b) an end product. The end product can be any product that includes integrated circuit chips, including computer products or devices having a display, a keyboard or other input device, and a central processor.

Having described preferred embodiments of a methods and structures disclosed herein, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming an electrical device comprising:
   forming a plurality of fin structures, wherein at least one of the plurality of fin structures is a decoupling fin structure, and at least one of the plurality of fin structures is a semiconductor fin structure having at least one physical dimension substantially similar to a corresponding physical dimension of the decoupling fin structure;
   forming a fin type field effect transistor (FinFET) from each of said semiconductor fin structure; and
   forming a decoupling capacitor from each of said decoupling fin structures, the decoupling capacitor including a first electrode provided by the decoupling fin structure, a node dielectric and a second electrode provided by a metal contact that transmits electrical current from a power line to the FinFET.

2. The method of claim 1, wherein said each of the plurality of fin structures have substantially a same composition.

3. The method claim 1, wherein the decoupling fin structure has a length substantially parallel to a length of a power line.

4. The method of claim 3, wherein the decoupling fin structure is present directly under the power line.

5. The method of claim 1, wherein the decoupling fin structure is present directly under a via connecting the metal contact to the power line.

6. A method of forming an electrical device comprising:
   forming a plurality of fin structures, wherein at least one of the plurality of fin structures is a decoupling fin structure, and at least one of the plurality of fin structures is a semiconductor fin structure having at least one physical dimension substantially similar to a corresponding physical dimensions of the decoupling fin structure;
   forming a fin type field effect transistor (FinFET) from each of said semiconductor fin structure; and
   forming a decoupling capacitor from each of said decoupling fin structures.

7. The method of claim 6, wherein the decoupling capacitor including a first electrode provided by the decoupling fin structure.

8. The method of claim 7, wherein the decoupling capacitor further comprises a node dielectric present on the first electrode.

9. The method of claim 8, wherein a second electrode is provided by a metal contact that is present on the node dielectric, wherein the metal contact transmits electrical current from the power line to the FinFET.

10. The method of claim 6, wherein said each of the plurality of fin structures have substantially a same composition.

11. The method claim 6, wherein the decoupling fin structure has a length substantially parallel to a length of the power line.

12. The method of claim 11, wherein the decoupling fin structure is present directly under the power line.

13. The method of claim 6, wherein the decoupling fin structure is present directly under a via connecting the metal contact to the power line.

14. A method of forming an electrical device comprising:
   forming a plurality of fin structures, wherein at least one of the plurality of fin structures is a decoupling fin structure, and at least one of the plurality of fin structures is a semiconductor fin structure;
   forming a fin type field effect transistor (FinFET) from each of said semiconductor fin structure; and
   forming a decoupling capacitor from each of said decoupling fin structures, the decoupling capacitor including a first electrode provided by the decoupling fin structure, a node dielectric and a second electrode provided by a metal contact that transmits electrical current from a power line to the FinFET, wherein the decoupling fin structure has a length substantially parallel to a length of a power line, and the power line has a greater width than the decoupling fin structure.

15. The method of claim 14, wherein each of the plurality of fin structures have substantially a same composition.

16. The method of claim 14, wherein physical dimensions of the decoupling fin structure are equal to physical dimensions of the semiconductor fin structure.

17. The method of claim 14, wherein the decoupling fin structure is present directly under the power line.

18. The method of claim 14, wherein the decoupling fin structure is present directly under a via connecting the metal contact to the power line.

* * * * *